United States Patent
Zhao et al.

[11] Patent Number: 5,858,558
[45] Date of Patent: Jan. 12, 1999

[54] NICKEL-BASE SIGMA-GAMMA IN-SITU INTERMETALLIC MATRIX COMPOSITE

[75] Inventors: Ji-Cheng Zhao; Melvin Robert Jackson, both of Niskayuna, N.Y.

[73] Assignee: General Electric Company, Schenectady, N.Y.

[21] Appl. No.: 739,536

[22] Filed: Oct. 30, 1996

[51] Int. Cl.⁶ .............. B32B 15/00; B05D 3/06; C23C 16/00; B63H 1/26
[52] U.S. Cl. .................. 428/680; 148/442; 148/419; 148/404; 148/538; 148/537; 148/522; 148/428; 148/555; 416/241 R; 416/223 R; 427/124; 427/142; 427/248.1; 427/250; 427/566
[58] Field of Search .................. 148/404, 410, 148/419, 428, 442, 522, 537, 555, 538, 562, 527; 416/223 R, 241 R; 428/680; 427/124, 142, 248.1, 250, 566

[56] References Cited

U.S. PATENT DOCUMENTS 3,671,223 6/1972 Thompson et al. ............... 148/404
3,783,033 1/1974 Tarshis ............................. 148/404
4,764,225 8/1988 Shankar et al. .................. 148/404

FOREIGN PATENT DOCUMENTS 1496930 11/1975 United Kingdom.

OTHER PUBLICATIONS

E. Grundy, "Solidification and Properties of Ni–Cr–Mo and Ni–Cr–W Monovariant Eutectics", Conference on In Situ Composites–III (1979), pp. 431–440.

Primary Examiner—Margery Phipps
Attorney, Agent, or Firm—Noreen C. Johnson; Douglas E. Stoner

[57] ABSTRACT

A nickel-base gamma-sigma intermetallic matrix composite material suitable for forming gas turbine engine components and structural coatings for such components. The composite material contains, in weight percent, about 20 to 50 chromium, about 0 to 32 molybdenum, and about 0.5 to 7 silicon, with the balance being nickel and incidental impurities. In addition, the composite material may contain aluminum and titanium in amounts of up to about 7 and 3 weight percent, respectively. The resulting intermetallic matrix composite material is characterized by a sigma volume fraction of greater than 30 percent, preferably at least about 50 percent, and may have a dendritic, fibrous or lamellar microstructure. The composite material can be cast to form a component, or deposited by known techniques to form a structural coating on a component.

20 Claims, 1 Drawing Sheet

NICKEL-BASE SIGMA-GAMMA IN-SITU INTERMETALLIC MATRIX COMPOSITE

This invention was made with Government support under Contract No. N68335-94-C-0207 awarded by the Department of the Navy. The Government has certain rights in this invention.

BACKGROUND OF THE INVENTION

The present invention relates to nickel-base materials suitable for high temperature applications. More particularly, this invention relates to a nickel-base intermetallic matrix composite material characterized by the presence of the sigma phase in a matrix of the gamma phase, or vice versa, and alloyed to yield a composite material from which high temperature castings and structural coatings can be formed.

High temperature cobalt-base and nickel-base superalloys are used in the manufacture of high-temperature gas turbine engine components, including nozzles, combustors, and turbine shrouds, vanes and blades. Gamma-prime ($\gamma'$) precipitation-strengthened nickel-base superalloys have found particularly wide use in gas turbine engines because they exhibit a desirable balance of creep, tensile and fatigue crack growth properties at elevated temperatures. These superalloys are generally characterized by gamma-prime intermetallic precipitates, principally $Ni_3(Al,Ti,Nb,Ta)$, formed in-situ in the gamma ($\gamma$) matrix (principally nickel, chromium, tungsten, rhenium, molybdenum and cobalt), and derive desirable properties from the presence of the gamma-prime precipitates and other alloying constituents at their grain boundaries.

While intermetallic compounds such as gamma-prime have the above-noted benefits, other intermetallic compounds can be detrimental to the mechanical properties of a nickel-base superalloy. An example is topologically close-packed (TCP) phases, including the sigma ($\sigma$) phase, characterized by plate-like or needle-like precipitates that have a detrimental effect on toughness. Therefore, TCP phases have traditionally been avoided in nickel-base superalloys, particularly for components that will be subjected to high stresses at elevated temperatures. However, limited investigations of sigma-phase nickel-base superalloys have been performed, as reported by E. Grundy in *Solidification and Properties of Ni—Cr—Mo and Ni—Cr—W Monovariant Eutectics*, Conference on In Situ Composites-III, p. 431 (1979), and as disclosed in British Patent No. 1,496,930 to Grundy.

The Grundy article and patent report the study of planar front, directionally-solidified (DS) gamma-sigma eutectics of various Ni—Cr—Mo ternary alloys. To obtain a planar solidification front resulting in a lamellae alignment of the sigma phase precipitates, solidification was maintained at a rate of about three centimeters per hour or less. Grundy discloses that the evaluated alloys generally exhibited good oxidation resistance, creep rupture resistance and tensile strength at high temperatures, particular those alloys containing about 15 to 30 weight percent molybdenum. A preferred alloy was said to contain, in weight percent, 34 chromium and 20 molybdenum with the balance nickel, and with a sigma volume fraction of about 30 percent. Potential additional constituents were said to be aluminum, titanium, niobium and tantalum, so long as their combined presence did not exceed 6 weight percent, preferably not more than 3 weight percent, of the alloy. Since the publication of the Grundy article and patent, little additional investigations have been pursued to find practical applications for gamma-sigma intermetallic nickel-base alloys.

Because the efficiency of a gas turbine engine is dependent on its operating temperatures, there is a demand for components, and particularly turbine blades, that are capable of withstanding higher temperatures. As the material requirements for gas turbine engine components have increased, various processing methods and alloying constituents have been suggested to enhance the mechanical properties of gamma-prime precipitation-strengthened nickel-base superalloys. In general, advancements in such technologies have been such that the maximum local metal temperatures of components formed from these superalloys are approaching the alloy melting temperatures. Accordingly, in terms of high temperature capability, it is likely that only modest improvements will be possible in the future for gamma-prime precipitation-strengthened nickel-base superalloys.

SUMMARY OF THE INVENTION

It is an object of this invention to provide an intermetallic matrix composite for components subjected to high operating temperatures and stresses.

It is a further object of this invention that such a composite is characterized by a nickel-base gamma matrix characterized by a large volume fraction of the in-situ intermetallic sigma phase or other TCP phases.

It is another object of this invention that such a composite can be solidified by directional solidification (DS) methods to form a cast component characterized by a dendritic, fibrous or lamellar microstructure.

It is still another object of this invention that such a composite can be generated when deposited by a variety of deposition techniques to form a microlaminate structural coating.

It is yet another object of this invention that such a composite is particularly suitable to form turbine blades and turbine blade structural coatings for a gas turbine engine.

In accordance with a preferred embodiment of this invention, these and other objects and advantages are accomplished as follows.

According to the present invention, there is provided a nickel-base gamma-sigma intermetallic matrix composite (IMC) material that is suitable for forming gas turbine engine components and structural coatings for such components. The composite material contains, in weight percent, about 20 to 50 chromium, about 0 to 32 molybdenum, and about 0.5 to 7 silicon, with the balance being nickel and incidental impurities. In addition, the composite material may contain aluminum and titanium in amounts of up to about 7 and 3 weight percent, respectively. The resulting matrix composite material is preferably characterized by a sigma volume fraction of greater than 30 percent, up to about 90 percent, and can be cast to form a component or deposited by known techniques to form a structural coating on a component.

According to this invention, the intermetallic matrix composite material is characterized by the brittle sigma phase in the ductile gamma phase as dendrite-like, rod-like or lamella-like structures having a high aspect-ratio (e.g., a length-to-width ratio of greater than ten), and exhibits excellent toughness at both ambient and elevated temperatures. The toughness, strength and oxidation resistance of the composite material is such that the material is suitable for a wide variety of high temperature applications, and can be employed as a structural coating or casting material.

Other objects and advantages of this invention will be better appreciated from the following detailed description.

BRIEF DESCRIPTION OF THE DRAWINGS

The above and other advantages of this invention will become more apparent from the following description taken in conjunction with the accompanying drawings, in which.

DETAILED DESCRIPTION OF THE INVENTION

Figure 1:
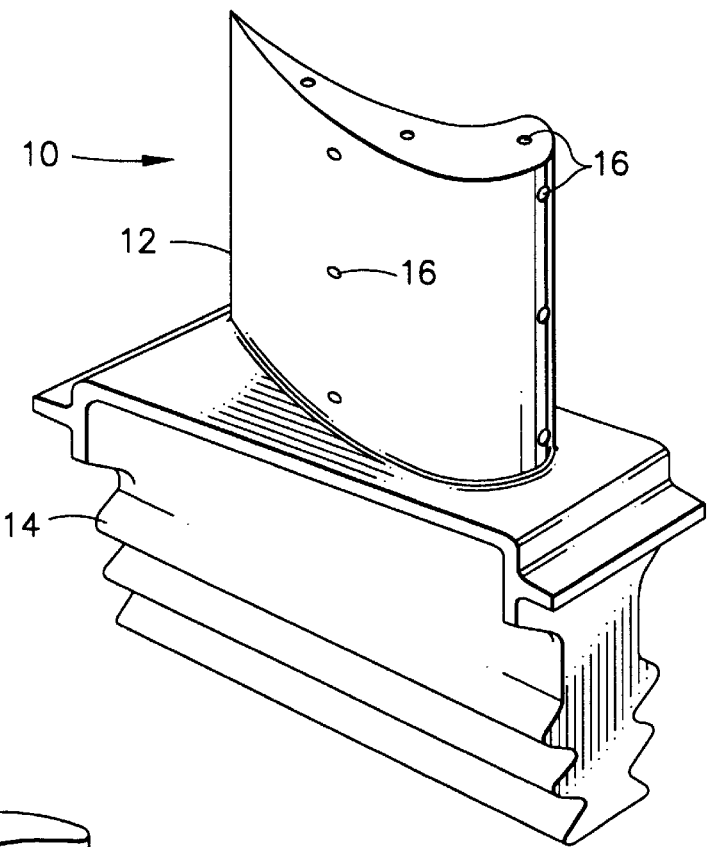
FIG. 1 is a perspective view of a gas turbine engine turbine blade cast from an intermetallic matrix composite material in accordance with this invention.
Figure 2:
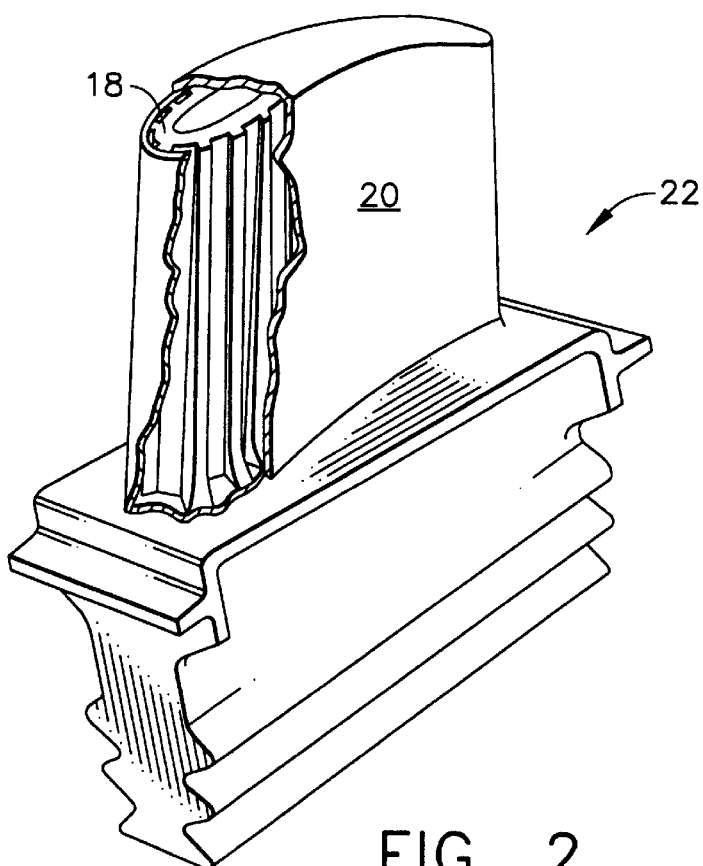
FIG. 2 is a perspective view of a gas turbine engine turbine blade, represented as having a cast central spar substrate overlaid by a structural coating, either or both of which are formed of an intermetallic matrix composite material in accordance with this invention.

The present invention provides an intermetallic matrix composite (IMC) material that is suitable for forming components and structural coatings for components that must operate at elevated temperatures. Particular examples of such components are represented in FIGS. 1 and 2 as, respectively, a cast turbine blade 10 of a gas turbine engine and a turbine blade 22 comprising a cast central spar substrate 18 overlaid by a structural coating 20. Other notable examples of such high-temperature components include the high and low pressure turbine nozzles, shrouds, combustor liners and augmentor hardware of gas turbine engines. Conventionally, blades of the type shown are formed from cobalt and nickel-base superalloys whose compositions are specially formulated to withstand the hostile thermal and corrosive environment of a gas turbine engine, and which are processed to develop a particular microstructure that promotes high temperature properties. While the advantages of this invention will be illustrated and described with reference to turbine blades of gas turbine engines, the teachings of this invention are generally applicable to a wide variety of components that must operate within a hostile thermal environment.

As is generally conventional, the blade 10 shown in FIG. 1 includes an airfoil section 12 against which hot combustion gases are directed during operation of the gas turbine engine, and whose surface is therefore subjected to high temperatures and severe attack by oxidation, corrosion and erosion. The airfoil section 12 is anchored to a turbine disk (not shown) through a root section 14. Cooling passages 16 are present through the airfoil section 12 through which bleed air is forced to transfer heat from the blade 10. According to this invention, the entire blade 10 may be formed from the intermetallic matrix composite material of this invention. Alternatively, and as generally represented in FIG. 2, the intermetallic matrix composite material of this invention may be present as a structural coating 20 on the cast spar 18 of a turbine blade 22. Notably, the spar 18 may be cast from the composite material of this invention or from other single-crystal superalloys. The structural coating 20 of this invention can be formed by known coating methods, such as electron beam physical vapor deposition (EB-PVD). The composite material has the advantage of being a relatively simple alloy, which permits its deposition by EB-PVD, in contrast to conventional superalloys that typically have about eleven elements with very narrow workable composition ranges, such that deposition by EB-PVD is extremely difficult.

The intermetallic composite material of this invention is generally a Ni—Cr alloy with selective alloying additions that yield the desired properties through the creation of the sigma phase or other TCP phases. The brittle sigma phase may be present as dendrite-like, rod-like or lamella-like structures having a high aspect-ratio, e.g., a length-to-width ratio of greater than ten. Contrary to the prior art as evidenced by the Grundy article and patent, the gamma and TCP phases do not necessarily have a lamellar microstructure created by planar-front directional solidification (DS) occurring at a relatively low rate, because such a lamellar microstructure restricts the volume fraction of the sigma phase to that found approximately at the eutectic composition, i.e., about 30 percent or lower. Instead, a higher DS rate is intentionally used, promoting a dendritic microstructure for most composite materials of this invention. Furthermore, and also contrary to the prior art, the sigma phase constitutes a volume fraction of greater than 30%, and preferably at least 50% and as high as about 90%. As such, the intermetallic composite material of this invention is formulated and processed differently than prior art composites. In addition, many composite materials of this invention are suitable for deposition by EB-PVD processing, by which a polycrystalline lamellar (i.e., microlaminate) microstructure is formed and by which the volume fraction of the sigma (or other TCP) phase is not restricted by the eutectic solidification reaction.

A base composition for the intermetallic matrix composite material of this invention is, in weight percent, about 20 to 50 chromium, about 0 to 32 molybdenum, and about 0.5 to 7 silicon, with the balance being nickel and incidental impurities. Alloying additions of up to about 7 weight percent aluminum and up to about 3 weight percent titanium are also within the scope of this invention, as well as possible additions of rhenium, tungsten, tantalum, niobium, cobalt, and other alloying constituents that may be added to nickel-base superalloys. In addition, germanium may partially replace silicon in the strengthening TCP phase. The relative amounts of these constituents and the manner in which the composite material is formed yield the desired microstructural characteristics. Specifically, to promote the volume fraction of the sigma phase, relatively large amounts of chromium, molybdenum, silicon and possibly aluminum are employed. In addition, for DS materials, a relatively rapid solidification rate (e.g., at least about 10 centimeters per hour) is employed to achieve dendritic (nonplanar-front) growth and to increase the volume fraction of the sigma phase. This latter aspect of the invention can be obtained by directional solidification processing methods known in the art. Alternatively, suitable results can be achieved by depositing the composition as a structural coating using such methods as physical vapor deposition (PVD) techniques, including EB-PVD. For the latter, the substrate (e.g., spar 18 of FIG. 2) can be alternately subjected to sigma-forming and gamma-forming vapor clouds to form the structural coating (e.g., structural coating 20 of FIG. 2).

Based on a study of the phase equilibrium of the Ni—Cr—Mo—Si—Al—Ti system, selective alloying additions of silicon, aluminum and titanium were made to a base Ni—Cr alloy. In addition to minimizing the density of the composite material, the desirable effects of such alloying additions were determined to include an increase in the strength of the sigma and gamma phases and improved oxidation and rupture resistance. Moreover, several of the gamma-sigma alloys based on the Ni—Cr—Si system were evaluated, as opposed to alloys of the Ni—Cr—Mo system of the type investigated in the prior art.

To facilitate the evaluation of the base composition for the intermetallic matrix composite material of this invention, alloy compositions were generally selected to have one of three ranges for chromium content. A first group of alloys contained, in weight percent, about 43 to 46 chromium, about 2 to 6 silicon, about 1 to 7 aluminum, and about 0 to 3 titanium, with the balance being nickel. A second group was formulated to contain, in weight percent, about 34 to 38 chromium, about 14 to 16 molybdenum, about 0.5 to 4 silicon, about 2 to 3 aluminum, and about 0 to 1 titanium, with the balance being nickel. Finally, the third alloy group contained, in weight percent, about 27 to 29 chromium, about 20 to 28 molybdenum, about 0.5 to 4 silicon and about 2 to 4 aluminum, with the balance being nickel. Specific alloys investigated during the evaluation of this invention are summarized below.

| Specimen | Composition (in weight percent) | | | | | |
| --- | --- | --- | --- | --- | --- | --- |
| | Ni | Cr | Mo | Si | Al | Ti |
| A (OG162) | 47 | 33 | 20 | — | — | — |
| B (OG163) | 49 | 35 | 14 | 2 | — | — |
| C (OG164) | 47 | 34 | 14 | 2 | 3 | — |
| D (OG165) | 44 | 32 | 21 | — | 3 | — |
| E (OG166) | 46 | 38 | 16 | — | — | — |
| F (OG170) | 44 | 35 | 16 | 2 | 2 | — |
| G (OG171) | 45 | 34 | 16 | 2 | 3 | — |
| H (OG172) | 44 | 34 | 16 | 2 | 3 | 1 |
| I (OG173) | 45 | 36 | 14 | 3 | 2 | — |
| J (OG174) | 44 | 29 | 20 | 3 | 4 | — |
| K (OG175) | 45 | 29 | 21 | — | 4 | — |
| L (OG176) | 44 | 27 | 23 | 3 | 2 | — |
| M (OG179) | 39 | 35 | 24 | — | 2 | — |
| N (OG180) | 35 | 37 | 27 | — | 1 | — |
| O (OG181) | 29 | 38 | 32 | — | 1 | — |
| P (OG182) | 40 | 27 | 28 | 3 | 2 | — |
| Q (OG153) | 46 | 46 | — | 6 | 2 | — |
| R (OG154) | 49 | 43 | — | 6 | 3 | — |
| S (OG155) | 47 | 45 | — | 6 | 1 | 1 |
| T (OG157) | 46 | 44 | — | 3 | 4 | 3 |
| U (OG158) | 52 | 43 | — | 2 | 2 | 1 |
| V (OG159) | 42 | 46 | — | 3 | 7 | 2 |

Each of the above compositions was directionally solidified at a rate of about 20 centimeters per hour, yielding the desired dendritic nonplanar-front growth. Specimen A was formulated to have the same composition as that preferred by the prior art, though differing microstructurally (and therefore having different mechanical properties) due to the higher solidification rate employed in accordance with this invention. Specimens D, E, K, M and N were generally formulated to lie within the broad composition ranges taught by Grundy, though again differing significantly in terms of microstructure, sigma phase volume fraction and mechanical properties due to the higher solidification rate employed.

Specimens B, C and D were alloyed to evaluate the individual effects of silicon and aluminum, while Specimens F, G, H and I were alloyed to explore the effects of increasing the silicon content and decreasing the molybdenum content on alloy properties. Specimens D, E and I were also alloyed to increase the volume fraction of the sigma phase away from the eutectic restriction.

Phase chemistry and phase mormorphology analysis of Specimens B and C showed that silicon was approximately equally distributed in the gamma and sigma phases, while aluminum was heavily partitioned toward the gamma phase. In addition, the analysis of Specimens B and C also evidenced that a small amount of an additional TCP phase (i.e., other than the sigma phase) was present. In response, Specimen F was formulated to eliminate this phase. Specimens G, J and K were alloyed to promote gamma prime phase strengthening through higher alloying amounts of aluminum, and Specimen H was formulated to evaluate the influence of titanium. Specimens L, M, N and O were alloyed to further increase the volume fraction of the sigma phase, some as high as about 90 percent. Specimen P was formulated to explore the properties of a gamma-TCP in-situ composite. Finally, Specimens Q through V were formulated to evaluate entirely new gamma-sigma composites in the Ni—Cr—Si system.

Most of the specimens were found to have a solidus temperature (incipient melting point) higher than 1300° C. As directionally solidified specimens having the above-noted compositions, the intermetallic matrix composite material of this invention had a tensile yield strength of up to about 50 ksi at about 1100° C.

Severe oxidation testing was performed on the specimens, involving a high temperature soak in a furnace for a specified duration, followed by removal and immediate transfer to a cold plate. The oxidation behavior of selected alloys is summarized in the following table.

| Specimen | Temp (°C.) | Time (hrs) | Weight Change (mg/cm$^2$) |
| --- | --- | --- | --- |
| A | 1150 | 100 | −54 |
| B | 1150 | 100 | −9 |
| C | 1150 | 100 | −10 |
| D | 1150 | 100 | −17 |
| E | 1150 | 100 | −37 |
| F | 1150 | 100 | −12 |
| G | 1150 | 100 | −11 |
| H | 1150 | 100 | −21 |
| I | 1150 | 100 | −17 |
| J | 1150 | 100 | −4 |
| K | 1150 | 100 | −14 |
| L | 1150 | 100 | −11 |
| M | 1150 | 100 | −17 |
| N | 1150 | 100 | −27 |
| O | 1150 | 100 | −16 |
| Q | 1150 | 200 | +2 |
| R | 1150 | 200 | +5 |
| S | 1150 | 200 | −3 |
| T | 1150 | 200 | +6 |
| U | 1150 | 200 | −32 |
| V | 1150 | 200 | −39 |

The visual appearance of the specimens when transferred to the cold plate was an immediate loss of thermal color, e.g., within about one second. This thermal shock was very severe each time the specimens were cycled in and out of the furnace.

Some composites based on the new Ni—Cr—Si system, e.g., Specimens Q, R, S and T, exhibited outstanding oxidation resistance, far better than that of Grundy's preferred alloy, e.g., Specimen A. It was also concluded that silicon additions (e.g., 0.5 weight percent or more) improve the oxidation resistance of the Ni—Cr—Mo base gamma-sigma composites. Notably, Specimen Q exhibited oxidation resistance as good as that of a typical NiCrAlY coating usually employed to protect superalloys in hostile environment.

The cast specimens served to identify the phase chemistry and composition ranges of composite materials within the scope of this invention. Scanning electron microscopy (SEM) and electron probe micro-analysis (EPMA) confirmed that most of the specimens were mostly composed of gamma and sigma phases, with some having a small fraction of other phases, e.g., other TCP phases or the beta (NiAl) phase. Some of the specimens appeared to be more suitable for EB-PVD processing because of their high volume fraction of the sigma phase.

The above results evidenced the suitability of the intermetallic matrix composite material of this invention as both a substrate material and a structural coating material for high temperature applications. For example, with reference to FIG. 2, the composite material may be cast to form the blade substrate (spar 18), or deposited by PVD methods to form a heat and corrosion-resistant structural coating 20 on the substrate. In the latter embodiment, the substrate can be formed of a conventional turbine blade material, such as a cobalt or nickel-base superalloy. Alternatively, the substrate can be cast from the composite material of this invention.

In view of the above, it can be appreciated that a significant advantage of this invention is that the nickel-base gamma-sigma intermetallic matrix composite material is viable as a material for a variety of components that are subjected to high temperatures and stresses. The elevated melting temperature of the composite material, coupled with its high strength, corrosion resistance and toughness, offers a significant advancement in gas turbine engine performance as a result of the possibility of higher operating temperatures. Another significant aspect of this invention is that high temperature components can be formed from and coated with the composite material using known casting and deposition processes, respectively. As such, the invention can be implemented without requiring unconventional processing equipment and methods.

While our invention has been described in terms of a preferred embodiment, it is apparent that other forms could be adopted by one skilled in the art. For example, various processing techniques could be adopted to obtain or modify the properties of the composite material. Therefore, the scope of our invention is to be limited only by the following claims.

What is claimed is:

1. A nickel-base gamma-sigma intermetallic matrix composite material comprising, in weight percent, about 20 to 50 chromium, about 0 to 32 molybdenum, about 0.5 to 7 silicon, about 0 to 7 aluminum, and about 0 to 3 titanium, with the balance being nickel and incidental impurities, characterized by a sigma volume fraction of greater than 30 percent.

2. A nickel-base gamma-sigma intermetallic matrix composite material as recited in claim 1, wherein the composite material is a directionally-solidified casting characterized by a dendritic, fibrous or lamellar microstructure.

3. A nickel-base gamma-sigma intermetallic matrix composite material as recited in claim 1, wherein the composite material is a structural coating characterized by a polycrystalline lamellar microstructure.

4. A nickel-base gamma-sigma intermetallic matrix composite material as recited in claim 1, consisting essentially of, in weight percent, about 43 to 46 chromium, about 2 to 6 silicon, about 1 to 7 aluminum, and about 0 to 3 titanium, with the balance being nickel.

5. A nickel-base gamma-sigma intermetallic matrix composite material as recited in claim 1, consisting essentially of, in weight percent, about 34 to 38 chromium, about 14 to 16 molybdenum, about 0.5 to 4 silicon, about 2 to 3 aluminum, and about 0 to 1 titanium, with the balance being nickel.

6. A nickel-base gamma-sigma intermetallic matrix composite material as recited in claim 1, consisting essentially of, in weight percent, about 27 to 29 chromium, about 20 to 28 molybdenum, about 0.5 to 4 silicon and about 2 to 4 aluminum, with the balance being nickel.

7. A component formed of the nickel-base gamma-sigma intermetallic matrix composite material recited in claim 1.

8. The component recited in claim 7, wherein the component is a turbine blade of a gas turbine engine.

9. A component having a structural coating formed of the nickel-base gamma-sigma intermetallic matrix composite material recited in claim 1.

10. The component recited in claim 9, wherein the component is a turbine blade of a gas turbine engine.

11. A process comprising the steps of:
providing a nickel-base composition comprising, in weight percent, about 20 to 50 chromium, about 0 to 32 molybdenum, about 0.5 to 7 silicon, about 0 to 7 aluminum, and about 0 to 3 titanium, with the balance being nickel and incidental impurities; and
forming a nickel-base gamma sigma intermetallic matrix composite material from the nickel-base composition, wherein the composite material is characterized by a volume fraction of the sigma phase of greater than 30 percent.

12. A process as recited in claim 11, wherein the composite material is characterized by a volume fraction of the sigma phase of at least about 50 percent.

13. A process as recited in claim 11, wherein the forming step entails directionally solidifying the nickel-base composition such that the nickel-base gamma-sigma intermetallic matrix composite material is a casting characterized by a dendritic, fibrous or lamellar microstructure.

14. A process as recited in claim 13, wherein the nickel-base composition is directionally solidified at a rate of at least 10 centimeters per hour such that the casting has a dendritic microstructure.

15. A process as recited in claim 11 wherein the forming step entails depositing the nickel-base composition such that the nickel-base gamma-sigma intermetallic matrix composite material is a structural coating on a component, the structural coating being characterized by a polycrystalline lamellar microstructure.

16. A process as recited in claim 11, wherein the nickel-base composition consists essentially of, in weight percent, about 43 to 46 chromium, about 2 to 6 silicon, about 1 to 7 aluminum, and about 0 to 3 titanium, with the balance being nickel.

17. A process as recited in claim 11, wherein the nickel-base composition consists essentially of, in weight percent, about 34 to 38 chromium, about 14 to 16 molybdenum, about 0.5 to 4 silicon, about 2 to 3 aluminum, and about 0 to 1 titanium, with the balance being nickel.

18. A process as recited in claim 11, wherein the nickel-base composition consists essentially of, in weight percent, about 27 to 29 chromium, about 20 to 28 molybdenum, about 0.5 to 4 silicon and about 2 to 4 aluminum, with the balance being nickel.

19. A process for producing an intermetallic matrix composite material characterized by high-temperature oxidation resistance, comprising the step of directionally solidifying a melt of a nickel-containing alloy to form a composite material characterized by a sigma volume fraction of greater than about 30 percent, wherein the alloy comprises, in weight percent, about 20 to 50 chromium, about 0 to 32 molybdenum, about 0.5 to 7 silicon, about 0 to 7 aluminum, and about 0 to 3 titanium, with the balance being nickel and incidental impurities.

20. The process of claim 19, wherein the nickel-containing alloy is directionally solidified at a rate of at least about 10 cm per hour.

* * * * *